United States Patent
Kim et al.

(10) Patent No.: US 9,874,604 B2
(45) Date of Patent: Jan. 23, 2018

(54) SEMICONDUCTOR DEVICE AND TEST SYSTEM INCLUDING THE SAME

(71) Applicant: SK hynix Inc., Gyeonggi-do (KR)

(72) Inventors: Min-Su Kim, Gyeonggi-do (KR); Jin-Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/145,539

(22) Filed: May 3, 2016

(65) Prior Publication Data

US 2017/0176517 A1    Jun. 22, 2017

(30) Foreign Application Priority Data

Dec. 16, 2015  (KR) .................. 10-2015-0179968

(51) Int. Cl.
*G01R 31/3187* (2006.01)
*G01R 31/28* (2006.01)
*G01R 31/26* (2014.01)
*H03K 3/037* (2006.01)

(52) U.S. Cl.
CPC ..... *G01R 31/2884* (2013.01); *G01R 31/2644* (2013.01); *H03K 3/037* (2013.01)

(58) Field of Classification Search
CPC ............ G01R 31/2886; G01R 31/2884; G01R 31/3008; G01R 31/3004; G01R 31/31924; G01R 31/31922; G01R 31/3191; G01R 31/318513; G01R 31/31937; G01R 31/06705; G01R 35/005; G01R 27/28; G01R 27/32

USPC ......... 324/750.01–750.02, 750.03, 601, 130, 324/762.02, 762.06
See application file for complete search history.

(56) References Cited

U.S. PATENT DOCUMENTS

| | | | |
|---|---|---|---|
| 8,531,194 B2 * | 9/2013 | Edwards | G01R 31/30 324/713 |
| 8,552,735 B2 * | 10/2013 | Hata | G01R 31/31924 324/537 |
| 8,675,432 B2 * | 3/2014 | Hong | G11C 29/1201 365/189.09 |
| 2012/0187977 A1 * | 7/2012 | Hong | G11C 29/1201 324/762.02 |
| 2012/0274396 A1 * | 11/2012 | Jang | G11C 29/12005 327/539 |

(Continued)

FOREIGN PATENT DOCUMENTS

KR    1020120078206    7/2012
KR    1020130012795    2/2013

Primary Examiner — Thang Le
(74) Attorney, Agent, or Firm — IP & T Group LLP

(57) ABSTRACT

A semiconductor device may include a first node coupled to a first pad to which a first voltage having a first voltage level is inputted; a second node coupled to a second pad to which a second voltage having a second voltage level is inputted; an internal voltage generation unit suitable for shifting a voltage level of the first node to generate an internal voltage having the second voltage level, and outputting the internal voltage to third and fourth nodes; a first internal circuit suitable for operating by employing a voltage of the second node; and a node coupling unit that electrically couples the second node to the third node during a test operation, and electrically separates the second node and the third node during a normal operation.

20 Claims, 5 Drawing Sheets

(56) References Cited

U.S. PATENT DOCUMENTS

| | | | |
|---|---|---|---|
| 2014/0002120 A1* | 1/2014 | Oh | H01L 23/58 324/750.3 |
| 2014/0055891 A1* | 2/2014 | Kwon | H01L 27/0292 361/56 |
| 2015/0054532 A1* | 2/2015 | Yoo | G01R 31/2879 324/750.01 |

* cited by examiner

SEMICONDUCTOR DEVICE AND TEST SYSTEM INCLUDING THE SAME

CROSS-REFERENCE TO RELATED APPLICATIONS

The present application claims priority of Korean Patent Application No. 10-2015-0179968 filed on Dec. 16, 2015, which is incorporated herein by reference in its entirety.

BACKGROUND

1. Field

Exemplary embodiments of the present invention relate to a semiconductor device and a test system including the same.

2. Description of the Related Art

FIG. 1 is a configuration diagram of a conventional test system.

Referring to FIG. 1, the test system may include a plurality of semiconductor devices 110_1 to 110_n and a test device 120 for testing the plurality of semiconductor devices 110_1 to 110_n.

Each of the plurality of semiconductor devices 110_1 to 110_n may include a first pad P1 for receiving a first voltage VCCE and a second pad P2 for receiving a second voltage VCCQ. A plurality of internal circuits (not illustrated in FIG. 1) included in the plurality of semiconductor devices 110_1 to 110_n may operate by employing one of the first voltage VCCE received through the first pad P1 and the second voltage VCCQ received through the second pad P2.

The test device 120 may include a plurality of voltage pads VP1 to VPn. Each of the plurality of voltage pads VP1 to VPn may be coupled to one of the first and second pads P1 and P2 of the semiconductor device and may supply a voltage required for an operation of the semiconductor device during a test operation.

For a normal test operation of semiconductor devices, it is necessary to supply all the first and second voltages VCCE and VCCQ to each semiconductor device. To this end, at least two voltage pads of the test device 120 should be allocated for each semiconductor device. Therefore, the test device 120 having the n voltage pads should test the n semiconductor devices 110_1 to 110_n at least twice because it is not possible to test them all at a single time.

SUMMARY

Various embodiments are directed to a test system for a semiconductor device, suitable for operating internal circuits of the semiconductor device by employing a voltage inputted through a single pad during a test operation. The test system may include nodes for supplying at least one voltage to one or more internal circuits of the semiconductor device which are internally coupled to each other. Various embodiments are also directed to the semiconductor device itself.

Various embodiments are directed to a semiconductor device and a test system, by which nodes for supplying different voltages are reliably cut from each other in an operation other than a test operation, thereby substantially preventing a back-powering problem.

Various embodiments are directed to a semiconductor device and a test system, by which pads used for receiving voltages in each semiconductor device are reduced in a test operation, resulting in an increase in the number of semiconductor devices which may be tested at a time.

In an embodiment, a semiconductor device may include: a first node coupled to a first pad to which a first voltage having a first voltage level is inputted; a second node coupled to a second pad to which a second voltage having a second voltage level is inputted; an internal voltage generation unit suitable for shifting a voltage level of the first node to generate an internal voltage having the second voltage level, and outputting the internal voltage to third and fourth nodes; a first internal circuit suitable for operating by employing a voltage of the second node; and a node coupling unit that electrically couples the second node to the third node during a test operation, and electrically separates the second node and the third node during a normal operation.

In another embodiment, a test system may include: a test device suitable for outputting a first voltage through a plurality of voltage pads; and a plurality of semiconductor devices each including a first pad to which the first voltage is inputted, a second pad to which a second voltage is inputted, a first internal circuit suitable for operating by employing the second voltage inputted to the second pad during a normal operation and operating by employing an internal voltage generated using the first voltage inputted to the first pad during a test operation, and a second internal circuit suitable for operating by employing the internal voltage, wherein during the test operation the first pads of the plurality of semiconductor devices are coupled to corresponding voltage pads of the plurality of voltage pads, and the second pads of the plurality of semiconductor devices are floated.

In another embodiment, a test system may include: a test device that outputs a first voltage through a plurality of voltage pads; and a plurality of semiconductor devices, wherein each semiconductor device includes: a first node coupled to a first pad to which the first voltage having a first voltage level is inputted; a second node coupled to a second pad to which a second voltage having a second voltage level is inputted; an internal voltage generation unit suitable for shifting a voltage level of the first node to generate an internal voltage having the second voltage level, and outputting the internal voltage to third and fourth nodes; a first internal circuit suitable for operating by employing a voltage of the second node; a second internal circuit suitable for operating by employing a voltage of the fourth node; and a node coupling unit that electrically couples the second node to the third node during a test operation, and electrically separates the second node and the third node during a normal operation.

In accordance with the present, technology, nodes for supplying different voltages to internal circuits of a semiconductor device are coupled to each other, so that it is possible to operate the internal circuits by using a voltage inputted through one pad in a test operation, and the nodes for supplying the different voltages are reliably cut from each other in an operation other than the test operation, thereby substantially preventing a back-powering problem.

In accordance with the present technology, pads used for receiving voltages in each semiconductor device are reduced in a test operation, resulting in an increase in the number of semiconductor devices which may be tested at a time.

DETAILED DESCRIPTION

Figure 1:
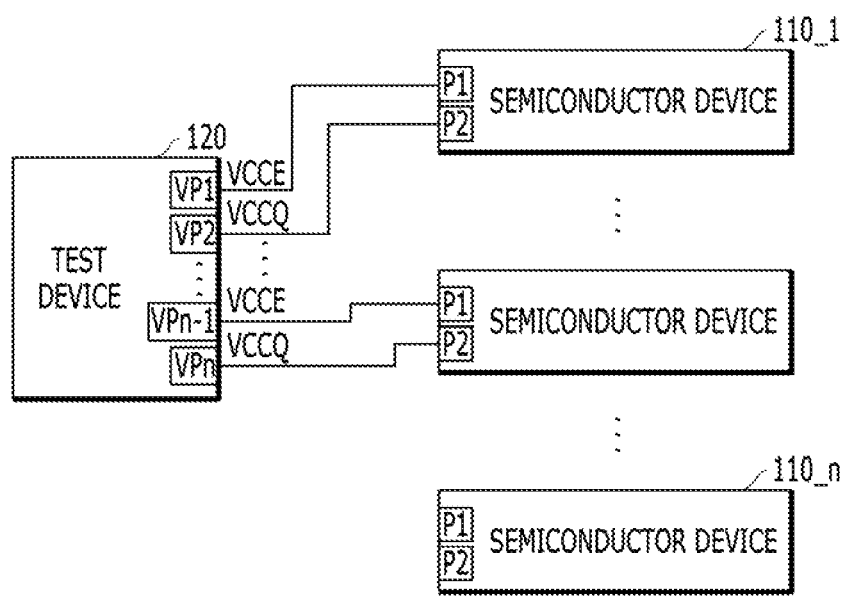
FIG. 1 is a configuration diagram of a conventional test system.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one element not only directly coupling another element but also indirectly coupling another element through an intermediate element. It will be understood that, although the terms "first", "second", "third", and so on may be used herein to describe various elements, these elements are not limited by these terms. These terms are used to distinguish one element from another element. Thus, for example, a first element described below could be termed a second element without departing from the spirit and scope of the present invention. In addition, it will also be understood that when an element is referred to as being "between" two elements, it can be the only element between the two elements, or one or more intervening elements may also be present.

It will be further understood that the terms "comprises", "comprising", "includes", and "including" when used in this specification, specify the presence of the stated elements, but do not preclude the presence or addition of one or more other elements.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 2:
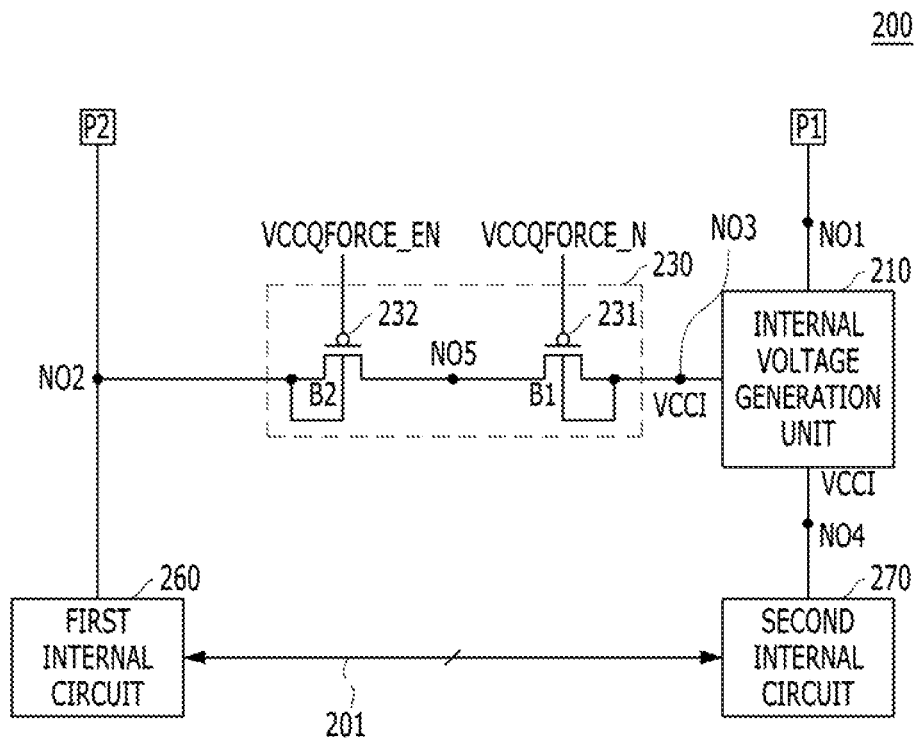
FIG. 2 is a configuration diagram of a semiconductor device, according to an embodiment of the present invention.
Figure 2:
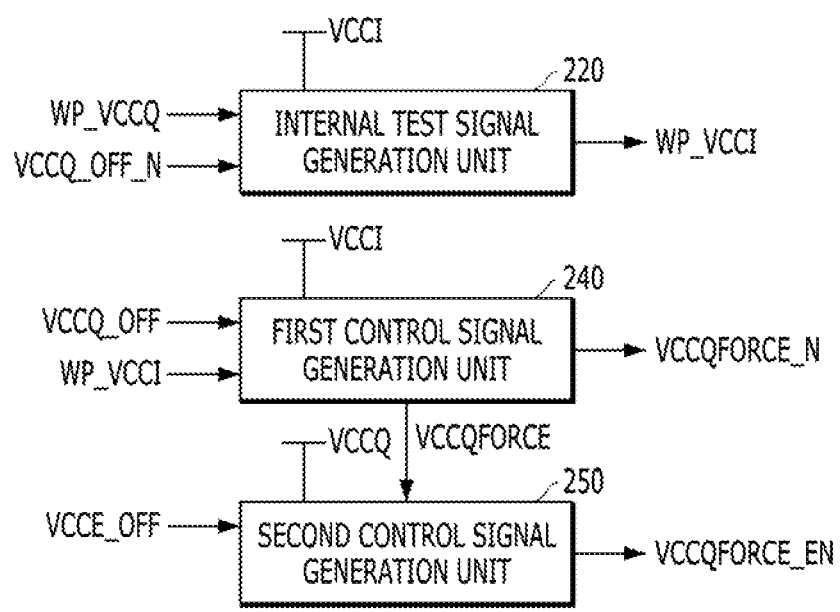

FIG. 2 is a configuration diagram of a semiconductor device generally designated by numeral 200, according to an embodiment of the present invention.

Referring to FIG. 2, the semiconductor device 200 may include a first pad P1, a second pad P2, an internal voltage generation unit 210, an internal test signal generation unit 220, a node coupling unit 230, a first control signal generation unit 240, a second control signal generation unit 250, a first internal circuit 260, and a second internal circuit 270.

The first pad P1 may be used to receive a first voltage VCCE having a first voltage level and the second pad P2 may be used to receive a second voltage VCCQ having a second voltage level. The first voltage level may be higher than the second voltage level. For example, the first voltage level may have a range of 2.7 V to 33 V and the second voltage level may be 1.8 V. The first pad P1 may be coupled to a first node NO1 and the second pad P2 may be coupled to a second node NO2.

Figure 7:
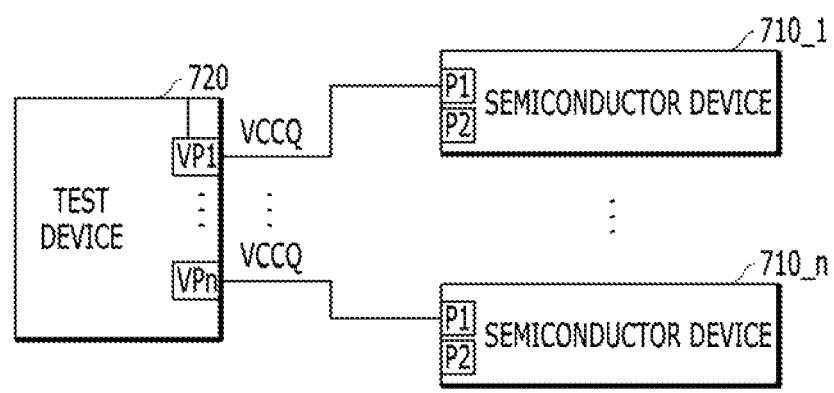
FIG. 7 is a configuration diagram of a test system, according to an embodiment of the present invention.

The semiconductor device 200 may be one of a plurality of semiconductor devices 710_1 to 710_n, illustrated in FIG. 7, and may receive the first voltage VCCE from a test device 720, also illustrated in FIG. 7, through the first pad P1 during a test operation. The semiconductor device 200 may receive the first voltage VCCE from a controller which controls the semiconductor device, through the first pad P1 during a normal operation. Furthermore, during the normal operation, the semiconductor device 200 may receive the second voltage VCCQ from the controller through the second pad P2. During the test operation, the second pad P2 may be floated (not coupled).

The internal voltage generation unit 210 may shift a voltage of the first node NO1 to generate an internal voltage VCCI having the second voltage level, and output the internal voltage VCCI to third and fourth nodes NO3 and NO4.

The internal test signal generation unit 220 may drive an internal test signal WP_VCCI to a ground voltage (VSS) level when a test signal WP_VCCQ is at the ground voltage level, and drive the internal test signal WP_VCCI to the internal, voltage VCCI when the test signal WP_VCCQ is at the second voltage level.

The node coupling unit 230 may electrically separate, the second node NO2 and the third node NO3 in an separation state while electrically coupling the second node NO2 to the third node NO3 in a connection state. The separation state may be changed into the connection state when the test signal WP_VCCQ is toggled M times or more in the state in which a voltage-off signal VCCQ_OFF has been activated, wherein the voltage-off signal VCCQ_OFF indicates whether the second voltage VCCQ is supplied or not. The connection state may indicate that an inverted first control signal VCCQFORCE_N is at the ground voltage level and a second control signal VCCQFORCE_EN is at the ground voltage level. The separation state may indicate that any one of the inverted first control signal VCCQFORCE_N and the second control signal VCCQFORCE_EN are at the second voltage level, not the ground voltage level. The node coupling unit 230 may be in the connection state during the test operation and in the separation state during the normal operation.

The voltage-off signal VCCQ_OFF may be deactivated when a voltage having the second voltage level is supplied to the second node NO2, and may be activated when the voltage is not supplied. Accordingly, the voltage-off signal VCCQ_OFF may be deactivated (for example, to a low level) when the second voltage VCCQ is supplied to the second node NO2 through the second pad P2 during the normal operation or when the second node NO2 is electrically coupled to the third node NO3 and the internal voltage VCCI is supplied to the second node NO2 during the test operation, and may be activated (for example, to a high level) in other cases.

The node coupling unit 230 may include a first PMOS transistor 231 which is coupled between the third node NO3 and a fifth node NO5 and is turned on/off in response to the inverted first control signal VCCQFORCE_N, and a second PMOS transistor 232 which is coupled between the second node NO2 and the fifth node NO5 and is turned on/off in response to the second control signal VCCQFORCE_EN, wherein a bulk B1 of the first PMOS transistor 231 is coupled to the third node NO3, and a bulk B2 of the second PMOS transistor 232 is coupled to the second node NO2. The first PMOS transistor 231 may be turned on when the inverted first control signal VCCQFORCE_N is at the ground voltage level and turned off when the inverted first control signal VCCQFORCE_N is at the second voltage level. The second PMOS transistor 232 may be turned on when the second control signal VCCQFORCE_EN is at the ground voltage level and turned off when the second control signal VCCQFORCE_EN is at the second voltage level.

When the first and second PMOS transistors 231 and 232 are turned on, the node coupling unit 230 may electrically couple the second node NO2 to the third node NO3, and may transfer the internal voltage VCCI from the third node NO3 to the second node NO2. When any one of the first and second PMOS transistors 231 and 232 are turned off, the node coupling unit 230 may electrically separate the second node NO2 and the third node NO3. Accordingly, it is possible to more reliably prevent a back-powering phenomenon, which indicates that a voltage applied to the second node NO2 is transferred to the third node NO3 and vice versa, by employing the structure in which the bulks B1 and B2 of the first and second PMOS transistors are respectively coupled to the third and second nodes NO3 and NO2.

The first control signal generation unit 240 may drive a first control signal VCCQFORCE to the internal voltage VCCI and drive the inverted first control signal VCCQFORCE_N to the ground voltage VSS when the internal test signal WP_VCCI is toggled M times in the state in which the voltage-off signal VCCQ_OFF has been activated.

The second control signal generation unit 250 may drive the second control signal VCCQFORCE_EN to the second voltage VCCQ when the first control signal VCCQFORCE is at the ground voltage level, and may drive the second control signal VCCQFORCE_EN to the ground voltage level when the first control signal VCCQFORCE is at the second voltage level.

The first internal circuit 260 may operate by employing the voltage of the second node NO2, and may be an interface circuit for communication between the semiconductor device and outside such as a controller, a test device or the like. The first internal circuit 260 may include an input buffer circuit for receiving signals from the outside, an output buffer circuit for outputting signals transferred from inside the semiconductor device to the outside, and the like. The first internal circuit 260 may operate by employing the second voltage VCCQ during the normal operation, and may operate by employing the internal voltage VCCI during the test operation.

A circuit, which communicates with the semiconductor device from the outside, may be the controller (not illustrated in FIG. 2) for controlling the semiconductor device during the normal operation, and may be a test device (720 of FIG. 7) during the test operation.

The second internal circuit 270 may operate by employing a voltage of a fourth node NO4, that is, the internal voltage VCCI, and may be a circuit for performing predetermined we rations according to input commands. For example, the second internal circuit 270 may include a cell array for storing data and peripheral circuits thereof. In such a case, when an input command is a program command, input data is programmed in memory cells selected by an input address, among a plurality of memory cells of the cell array. When the input command is a read command, data stored in memory cells selected by the input address, among the plurality of memory cells of the cell array, may be read and outputted to the outside. When the input command is an erase command, data stored in memory cells selected by the input address, among the plurality of memory cells of the cell array, may be erased.

In this case, a circuit for transferring signals (commands, addresses, and data) between the second internal circa it 270 and the outside may be the first internal circuit 260. Signals transferred from the first internal circuit 260 to the second internal circuit 370 or signals transferred from the second internal circuit 270 to the first internal circuit 260 may be transferred through a bus 201 including a plurality of signal lines.

The semiconductor device of FIG. 2 may generate the internal voltage VCCI by employing the first voltage VCCE inputted through the first pad P1 and operate all the first and second internal circuits 260 and 270 by employing the internal voltage VCCI during the test operation, thereby reducing the number of pads to be used for the test operation. Furthermore, by employing the structural characteristics of the node coupling unit 230, the second node NO2 is electrically and completely separated from the third node NO3 during the normal operation, so that it is possible to substantially prevent back-powering which may occur due to the structure in which the second and third nodes NO2 and NO3 have been coupled to each other. Furthermore, after the test signal WP_VCCQ has been toggled by N times, the second and third nodes NO2 and NO3 coupled electrically to each other and the test operation is performed, so that it is possible to substantially prevent problems which occur when the second and third nodes NO2 and NO3 are easily coupled to each other.

Figure 3:
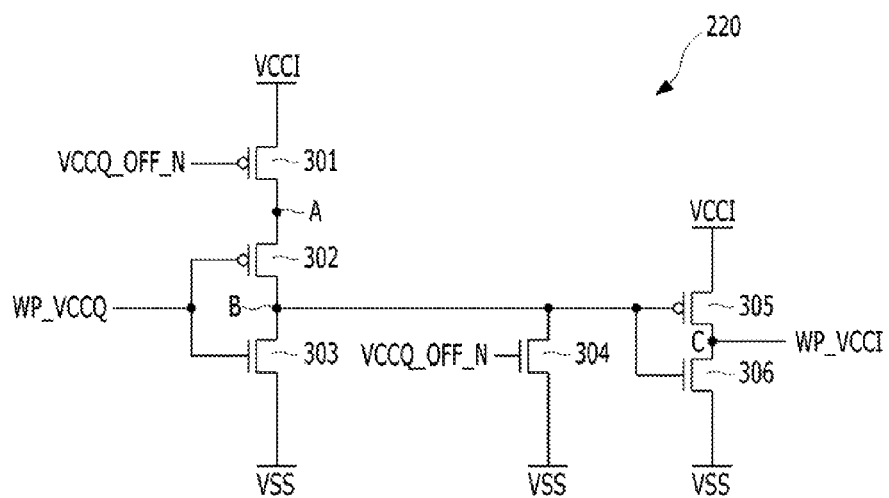
FIG. 3 is a configuration diagram of an internal test signal generation unit shown in FIG. 2, according to an embodiment of the present invention.

FIG. 3 is a configuration diagram of the internal test signal generation unit 220 shown in FIG. 2, according to an embodiment of the invention.

Referring to FIG. 3 the internal test signal generation unit 220 may include a plurality of transistors 301 to 306.

The first transistor 301 may be a PMOS transistor which has a first end to which the internal voltage VCCI is applied and a second end coupled to a node A, and is turned on/off in response to an inverted voltage-off signal VCCQ_OFF_N obtained by inverting the voltage-off signal VCCQ_OFF.

The second transistor 302 may be a PMOS transistor which is coupled between the node A and a node B, and is turned on/off in response to the test signal WP_VCCQ.

The third transistor 303 may be an NMOS transistor which has a first end coupled to the node B and a second end to which the ground voltage VSS is applied, and is turned on/off in response to the test signal WP_VCCQ.

The fourth transistor 304 may be an NMOS transistor which has a first end coupled to the node B and a second end to which the ground voltage VSS is applied, and is turned on/off in response to the inverted voltage-off signal VCCQ_OFF_N.

The fifth transistor 305 may be a PMOS transistor which has a first end to which the internal voltage VCCI is applied and a second end coupled to a node C, and is turned on/off in response to a voltage of the node B.

The sixth transistor 306 may be an NMOS transistor which has a first end coupled to the node C and a second end to which the ground voltage VSS is applied, and is turned on/off in response to the voltage of the node B. A signal generated from the node C may be the internal test signal WP_VCCI.

Accordingly, when the inverted voltage-off signal VCCQ_OFF_N maintains a high level, the internal test signal generation unit 220 may fix the internal test signal WP_VCCI to the internal voltage VCCI. When the inverted voltage-off signal VCCQ_OFF_N transits to a low level from the high level, the internal test signal generation unit 220 may drive the internal test signal WP_VCCI depending on the test signal WP_VCCQ.

Figure 4:
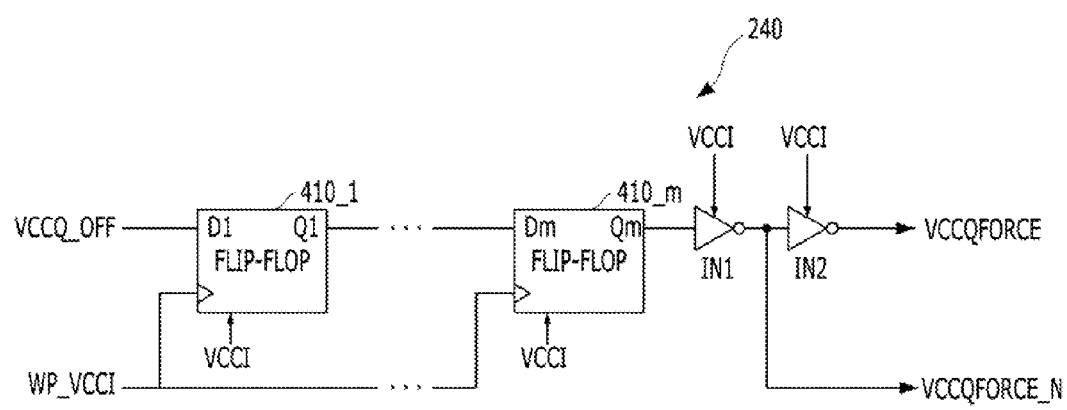
FIG. 4 is a configuration diagram of a first control signal generation unit shown in FIG. 2, according to an embodiment of the present invention.

FIG. 4 is a configuration diagram of the first control signal generation unit 240 shown in FIG. 2, according to an embodiment of the invention.

Referring to FIG. 4, the first control signal generation unit 240 may include M flip-flops 410_1 to 410_m and two inverters IN1 and IN2. The flip-flops 410_1 to 410_m and the inverters IN1 and IN2 may operate by employing the internal voltage VCCI.

The M flip-flops 410_1 to 410_m may be serially coupled to one another. The M flip-flops 410_1 to 410_m may respectively latch signals inputted to their own input terminals D1 to Dm whenever the internal test signal WP_VCCI is toggled, and output the latched signals to their own output terminals Q1 to Qm. Accordingly, in the state in which the voltage-off signal VCCQ_OFF has been activated (for example, to a high level) when the internal test signal WP_VCCI is toggled M times, the $M^{th}$ flip-flop 410_m may output its output signal (for example, to a high level) at the output terminal Qm.

The inverters IN1 and IN2 may respectively invert and output phases of signals inputted to them, wherein the signal outputted from the inverter IN1 may be the inverted first control signal VCCQFORCE_N and the signal outputted from the inverter IN2 may be the first control signal VCCQFORCE.

Figure 5:
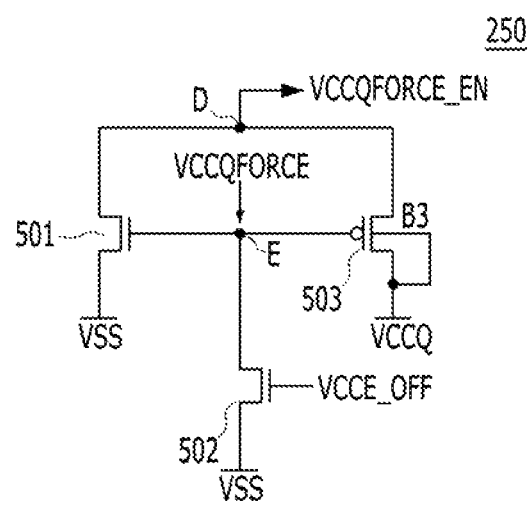
FIG. 5 is a configuration diagram of a second control signal generation unit shown in FIG. 2, according to an embodiment of the present invention.

FIG. 5 is a configuration diagram of the second control signal generation unit 250 shown in FIG. 2, according to an embodiment of the invention.

Referring to FIG. 5, the second control signal generation unit 250 may include a plurality of transistors 501 to 503.

The first transistor 501 may be an NMOS transistor which has a first end to which the ground voltage VSS is applied and a second end coupled to a node D, and is turned on/off in response to a voltage of a node E. A signal generated from the node D may be the second control signal VCCQ-FORCE_EN. The first control signal VCCQFORCE may be applied to the node E.

The second transistor 502 may be an NMOS transistor which has a first end to which the ground voltage VSS is applied and a second end coupled to the node E, and is turned on/off in response to a voltage-off signal VCCE_OFF. The voltage-off signal VCCE_OFF is a signal indicating whether the first voltage VCCE is supplied or not. That is, the voltage-off signal VCCE_OFF may be deactivated (for example, to a low level) when the first voltage VCCE is supplied to the first node NO1 through the first pad P1, and may be activated (for example, to a high level) when the first voltage VCCE is not supplied, For example, the voltage-off signal VCCE_OFF may be used to initialize the second control signal VCCQFORCE_EN to the second voltage level.

The third transistor 503 may be a PMOS transistor which has a first end to which the second voltage VCCQ is applied and a second end coupled to the node D, and is turned on/off in response to the voltage of the node E. Furthermore, the second voltage VCCQ may be applied to a bulk B3 of the third transistor 503.

Accordingly, when the first control signal VCCQFORCE maintains the ground voltage level, the second control signal generation unit 250 may drive the second control signal VCCQFORCE_EN to the second voltage VCCQ. When the first control signal VCCQFORCE transits to the second voltage level from the ground voltage level, the second control signal generation unit 250 may drive the second control signal VCCQFORCE_EN to the ground voltage level.

Figure 6:
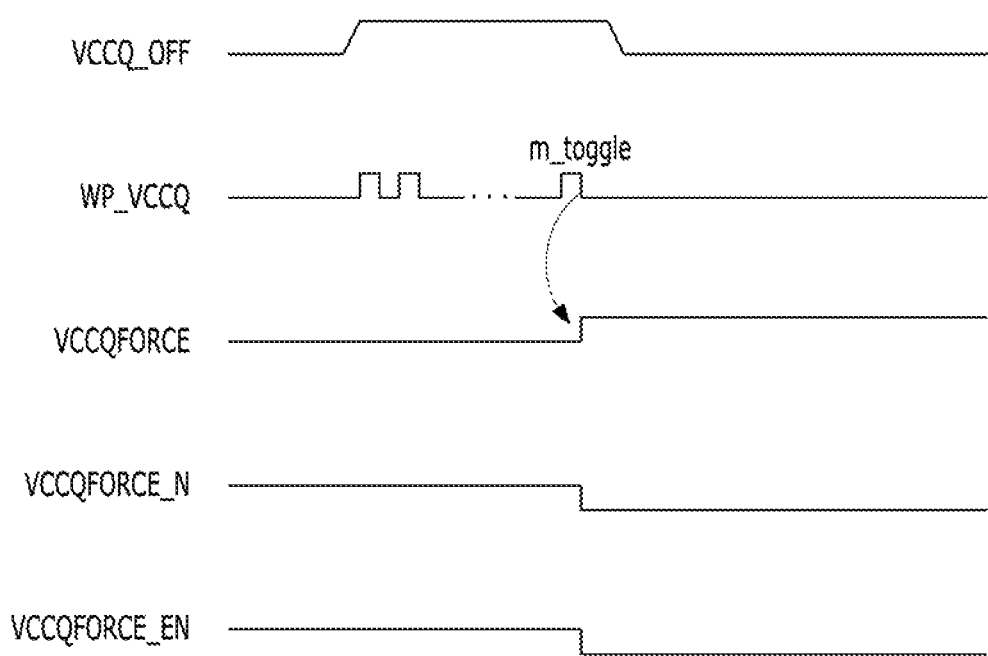
FIG. 6 is a waveform diagram or explaining operations of first and second control signal generation units shown in FIGS. 5 and 6, according to an embodiment of the present invention.

FIG. 6 is a waveform diagram for explaining operations of the first and second control signal generation units 240 and 250 shown in FIGS. 5 and 6, according to an embodiment of the invention.

Referring to FIG. 6, the voltage-off signal VCCQ_OFF may be activated when the second voltage VCCQ is not supplied to the second node NO2 through the second pad P2, and may be deactivated when the second voltage VCCQ is supplied to the second node NO2.

During a period in which the voltage-off signal VCCQ_OFF has been activated, when the test signal WP_VCCQ is toggled M times, the first control signal VCCQFORCE may transit from the ground voltage level to the second voltage level, the inverted first control signal VCCQFORCE_N may transit from the second voltage level to the ground voltage level, and the second control signal VCCQFORCE_EN may transit from the second voltage level to the ground voltage level. When both the inverted first control signal VCCQFORCE_N and the second control signal VCCQFORCE_EN reach the ground voltage level, the node coupling unit 230 electrically couple the second node NO2 to the third node NO3, so that the internal voltage VCCI may be supplied to the second node NO2 and thus the voltage-off signal VCCQ_OFF may be deactivated.

FIG. 7 is a configuration diagram of a test system, according to an embodiment of the present invention.

Referring to FIG. 7, the test system may include a plurality of semiconductor devices 710_1 to 710_n and a test device 720 for testing the plurality of semiconductor devices 710_1 to 710_n.

Each of the plurality of semiconductor devices 710_1 to 710_n may include a first pad P1 for receiving the first voltage VCCE and a second pad P2 for receiving the second voltage VCCQ. In the case of a normal operation, a plurality of internal circuits (260 and 270 of FIG. 2) included in the plurality of semiconductor devices 710_1 to 710_n may operate by employing one of the first voltage VCCE received through the first pad P1 and the second voltage VCCQ received through the second pad P2. However, in the case of a test operation, the plurality of internal circuits 260 and 270 included in the plurality of semiconductor devices 710_1 to 710_n may operate by employing the first voltage VCCE received through the first pad P1.

The test device 720 may include a plurality of voltage pads VP1 to VPn. The plurality of voltage pads VP1 to VPn may be respectively coupled to the first pads P1 of the semiconductor devices 710_1 to 710_n and may supply voltages required for operations of the semiconductor device during the test operation. In particular, during the test operation, the first pads P1 of the semiconductor devices 710_1 to 710_n may be coupled to the plurality of voltage pads VP1 to VPn of the test device 720 one to one, and the second pads P2 of the plurality of semiconductor devices 710_1 to 710_n may be floated.

Differently from the test system of FIG. 1, since the test system of FIG. 7 may supply only the first voltage VCCE to each semiconductor device during the test operation, the voltage pad used for each semiconductor device may be minimized. Consequently, it is possible for the test device 720 having the n voltage pads to test the plurality of semiconductor devices 710_1 to 710_n at a single time. Furthermore, even when the test device 720 generates only the first voltage VCCE it is possible to test the semiconductor devices 710_1 to 710_n by employing the test device 720.

In the test system of FIG. 7, during the test operation, the respective semiconductor devices 710_1 to 710_n may generate the internal voltage VCCI by employing the first voltage VCCE inputted through the first pad P1, and operate all the first and second internal circuits 260 and 270 by employing the internal voltage VCCI. Consequently, during the test operation, it is possible to reduce the number of voltage pads required for the respective semiconductor devices 710_1 to 710_n, and to test a larger number of semiconductor devices at a time. Furthermore, by employing the structural characteristics of the node coupling unit 230, the second node NO2 is electrically and completely separated from the third node NO3 during the normal operation, so that it is possible to substantially prevent back-powering which may occur due to the structure in which the second and third nodes NO2 and NO3 have been coupled to each other. Furthermore, only when the test signal WP_VCCQ has been toggled by N times, the second and third nodes NO2 and NO3 coupled electrically to each other and the test operation is performed, so that it is possible to substantially prevent problems which occur when the second and third nodes NO2 and NO3 are easily coupled to each other.

The test signal WP_VCCQ may be generated in the test device 720 and may be inputted to the semiconductor devices 710_1 to 710_n.

Although various embodiments have been described for Illustrative purposes, it will be apparent to those skilled in the art that various changes and modifications may be made without departing from the spirit and/or scope of the invention as defined in the following claims.

For example, the positions and types of the logic gates and transistors illustrated in the aforementioned embodiments may vary depending on the polarities of input signals.

What is claimed is:

1. A semiconductor device comprising:
a first node coupled to a first pad to which a first voltage having a first voltage level is inputted;
a second node coupled to a second pad to which a second voltage having a second voltage level is inputted;
an internal voltage generation unit suitable for shifting the first voltage, which is inputted to the first node, to generate an internal voltage having the second voltage level, and outputting the internal voltage to third and fourth nodes;
a first internal circuit suitable for operating by employing the second voltage, which is inputted to the second node; and
a node coupling unit that electrically couples the second node to the third node during a test operation, and electrically separates the second node and the third node during a normal operation.

2. The semiconductor device of claim 1, further comprising:
a second internal circuit suitable for operating by employing the internal voltage, which is inputted to the fourth node.

3. The semiconductor device of claim 2, wherein the first internal circuit is an interface circuit for communication between the semiconductor device and another device, and the second internal circuit is a circuit for performing a predetermined operation according to an input command.

4. The semiconductor device of claim 1, wherein the node coupling unit electrically separates the second node and the third node in an separation state while electrically coupling the second node to the third node in a connection state,
wherein the separation state is changed into the connection state when a test signal is toggled at least M times in a state in which a voltage-off signal is activated, the voltage-off signal indicating whether the second voltage is supplied or not.

5. The semiconductor device of claim 4, further comprising:
an internal test signal generation unit suitable for driving an internal test signal to a ground voltage level when the test signal is at the ground voltage level, and driving the internal test signal to the internal voltage when the test signal is at the second voltage level; and
a first control signal generation unit including M flip-flops serially coupled to one another, the first control signal generation unit suitable for driving a first control signal to the internal voltage and an inverted first control signal to the ground voltage level when the internal test signal is toggled at least M times in the state in which the voltage-off signal is activated.

6. The semiconductor device of claim 5, further comprising:
a second control signal generation unit suitable for driving a second control signal to the second voltage when the first control signal is at the ground voltage level, and driving the second control signal to the ground voltage level when the first control signal is at the second voltage level.

7. The semiconductor device of claim 6, wherein the node coupling unit comprises:
a first PMOS transistor coupled between the third node and a fifth node and is turned on/off in response to the inverted first control signal, wherein a bulk of the first PMOS transistor is coupled to the third node; and
a second PMOS transistor coupled between the second node and the fifth node and is turned on/off in response to the second control signal, wherein a bulk of the second PMOS transistor is coupled to the second node.

8. The semiconductor device of claim 5, wherein the voltage-off signal is deactivated when the second node is electrically coupled to the third node.

9. The semiconductor device of claim 1, wherein the first internal circuit operates by employing the second voltage during the normal operation, and operates by employing the internal voltage during the test operation.

10. A test system comprising:
a test device suitable for outputting a first voltage through a plurality of voltage pads; and
a plurality of semiconductor devices each including a first pad to which the first voltage is inputted, a second pad to which a second voltage is inputted, a first internal circuit suitable for operating by employing the second voltage inputted to the second pad during a normal operation and operating by employing an internal voltage generated, by an internal voltage generation unit, using the first voltage inputted to the first pad during a test operation, and a second internal circuit suitable for operating by employing the internal voltage,
wherein during the test operation the first pads of the plurality of semiconductor devices are coupled to corresponding voltage pads of the plurality of voltage pads, and the second pads of the plurality of semiconductor devices are floated.

11. The test system of claim 10, wherein the first internal circuit is an interface circuit for communication between the plurality of semiconductor devices and outside.

12. The test system of claim 10, wherein, during the normal operation, the first voltage is inputted to the first pads of the semiconductor devices and the second voltage is inputted to the second pads of the semiconductor devices.

13. The test system of claim 10, wherein each of the plurality of semiconductor devices further comprises:
a first node coupled to the first pad;
a second node coupled to the second pad;
an internal voltage generation unit suitable for shifting a voltage level of the first node to generate the internal voltage having a second voltage level, and outputting the internal voltage to third and fourth nodes; and
a node coupling unit that electrically couples the second node to the third node during the test operation, and electrically separates the second node and the third node during the normal operation,
wherein the first internal circuit operates by employing the second voltage, which is inputted to the second node and the second internal circuit operates by employing the internal voltage, which is inputted the fourth node.

14. The test system of claim 13, wherein the node coupling unit electrically separates the second node and the third node in an separation state while electrically coupling the second node to the third node in a connection state,
wherein the separation state is changed into the connection state when a test signal is toggled at least M times in a state in which a voltage-off signal is activated, the voltage-off signal indicating whether the second voltage is supplied or not.

15. The test system of claim 14, wherein each of the plurality of semiconductor devices further comprises:
an internal test signal generation unit suitable for driving an internal test signal to a ground voltage level when the test signal is at the ground voltage level, and driving the internal test signal to the internal voltage when the test signal is at the second voltage level; and
a first control signal generation unit includes a plurality of M flip-flops serially coupled to one another, and drives a first control signal to the internal voltage and an inverted first control signal to the ground voltage level when the internal test signal is toggled at least M times in the state in which the voltage-off signal is activated.

16. The test system of claim 15, wherein each of the plurality of semiconductor devices further comprises:
a second control signal generation unit suitable for driving a second control signal to the second voltage when the first control signal is at the ground voltage level, and driving the second control signal to the ground voltage level when the first control signal is at the second voltage level.

17. The test system of claim 16, wherein the node coupling unit comprises:
a first PMOS transistor that is coupled between the third node and a fifth node and is turned on/off in response to the inverted first control signal, wherein a bulk of first PMOS transistor is coupled to the third node; and
a second PMOS transistor that is coupled between the second node and the fifth node and is turned on/off in response to the second control signal, wherein a bulk of the second PMOS transistor is coupled to the second node.

18. The test system of claim 15, wherein the voltage-off signal is deactivated when the second node is electrically coupled to the third node.

19. A test system comprising:
a test device that outputs a first voltage through a plurality of voltage pads; and
a plurality of semiconductor devices,
wherein each semiconductor device includes:
a first node coupled to a first pad to which the first voltage having a first voltage level is inputted;
a second node coupled to a second pad to which a second voltage having a second voltage level is inputted;
an internal voltage generation unit suitable for shifting a voltage level of the first node to generate an internal voltage having the second voltage level, and outputting the internal voltage to third and fourth nodes;
a first internal circuit suitable for operating by employing the second voltage, which is inputted to the second node;
a second internal circuit suitable for operating by employing the internal voltage, which is inputted to the fourth node; and
a node coupling unit that electrically couples the second node to the third node during a test operation, and electrically separates the second node and the third node during a normal operation.

20. The test system of claim 19, wherein, during the test operation, the first pads of the plurality of semiconductor devices are coupled to the plurality of voltage pads of the test device one to one, and the second pads of the plurality of semiconductor devices are floated.

* * * * *